(12) United States Patent
Okoroanyanwu et al.

(10) Patent No.: US 6,884,735 B1
(45) Date of Patent: Apr. 26, 2005

(54) MATERIALS AND METHODS FOR SUBLITHOGRAPHIC PATTERNING OF GATE STRUCTURES IN INTEGRATED CIRCUIT DEVICES

(75) Inventors: Uzodinma Okoroanyanwu, Mountain View, CA (US); Alden Acheta, Brentwood, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 135 days.

(21) Appl. No.: 10/224,876

(22) Filed: Aug. 21, 2002

(51) Int. Cl.⁷ .......................... H01L 21/302; G03C 5/00
(52) U.S. Cl. .................... 438/725; 438/780; 430/312; 430/313
(58) Field of Search .................. 438/725, 780; 430/312, 313, 325, 330

(56) References Cited

U.S. PATENT DOCUMENTS

| | | | |
|---|---|---|---|
| 5,487,967 A | | 1/1996 | Hutton et al. |
| 5,585,215 A | * | 12/1996 | Ong et al. .................. 430/107 |
| 6,132,928 A | | 10/2000 | Tanabe et al. |
| 6,316,159 B1 | * | 11/2001 | Chang et al. ............. 430/270.1 |
| 6,319,853 B1 | * | 11/2001 | Isibashi et al. ............. 438/780 |
| 6,436,593 B1 | | 8/2002 | Minegishi et al. |
| 6,461,784 B1 | * | 10/2002 | Komine et al. ............. 430/162 |
| 6,472,120 B1 | * | 10/2002 | Jung et al. ............... 430/270.1 |
| 6,596,200 B1 | * | 7/2003 | Ogawa et al. .............. 252/512 |
| 6,716,571 B1 | * | 4/2004 | Gabriel et al. ............. 430/313 |
| 6,720,132 B1 | * | 4/2004 | Tsai et al. .................. 430/312 |
| 6,743,572 B1 | * | 6/2004 | Richter et al. ............. 430/322 |

OTHER PUBLICATIONS

M. Siebald, R. Sezi, R. Leuscher, H. Ahne, S. Birkle, *Proc. SPIE*, 528 (1990). 12 pgs.
M. Siebald, R. Sezi, R. Leuscher, H. Ahne, S. Birkle, *Microelectronic Engineering*, 531 (1990) 6 pgs.
M. Siebald, J. Berthold, M. Beyer, R. Leuscher, Ch. Nolsher, U. Scheler, R. Sezi, *Proc. SPIE*, 1446, paper 21 (1991). 13 pgs.
R. Leuscher, M. Beyer, H. Bomforder, E. Kuhn, Ch. Nolscher, M. Siebald, R. Sezi, *Proc. Soc. Plastic Engineers*, Mid–Hudson Section, Regional Technical Conference, 215, Oct. (1991). 12 pgs.

* cited by examiner

*Primary Examiner*—David S. Blum
(74) *Attorney, Agent, or Firm*—Foley & Lardner LLP (57) ABSTRACT

An integrated circuit fabrication process including exposing a photoresist layer and providing a hydrophilic layer above the photoresist layer. The photoresist layer is exposed to a pattern of electromagnetic energy. The polymers in the hydrophilic layer can diffuse into the photoresist layer after provision of the hydrophilic layer. The diffusion can lead to plasticization of the photoresist layer polymers in exposed regions relative to unexposed regions. The process can be utilized to form a large variety of integrated circuit structures including gate structures and other features with wide process latitude and smooth feature side walls.

20 Claims, 8 Drawing Sheets

MATERIALS AND METHODS FOR SUBLITHOGRAPHIC PATTERNING OF GATE STRUCTURES IN INTEGRATED CIRCUIT DEVICES

CROSS REFERENCE TO RELATED APPLICATIONS

The present application is related to U.S. application Ser. No. 10/208,370 by Okoroanyanwu, entitled "Materials and Methods for Sub-Lithographic Patterning of Contact, Via, and Trench Structures in Integrated Circuit Devices," filed on an even date herewith and assigned to the Assignee of the present application.

FIELD OF THE INVENTION

The present invention relates generally to integrated circuits (ICs). More particularly, the present application relates to systems for and processes of patterning of gate or other features on a layer or substrate utilized in IC fabrication.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, trenches, contact holes, vias, gate lengths, doped regions, and conductive lines, is driven by lithographic performance.

IC fabrication often utilizes a mask or reticle to form an image or pattern on one or more layers comprising a semiconductor wafer. Electromnagnetic energy such as radiation is provided or reflected off the mask or reticle to form the image on the semiconductor wafer. The wafer is correspondingly positioned to receive the radiation transmitted through or reflected off the mask or reticle. The radiation can be light at a wavelength in the ultraviolet (UV), vacuum ultraviolet (UV), deep ultraviolet (DUV), or extreme ultraviolet (EUV) range. The radiation can also be a particle beam such as an x-ray beam, an electron beam, etc.

Typically, the image on the mask or reticle is projected and patterned onto a layer of photoresist material disposed over the wafer. The areas of the photoresist material upon which radiation is incident undergo a photochemical change to become suitably soluble or insoluble in a subsequent development process. In turn, the patterned photoresist layer is used to define doping regions, deposition regions, etching regions, and/or other structures comprising the IC.

As integrated circuit device dimensions continue to shrink to increase the speed and density of devices, it becomes necessary to print contact hole and via features as well as gate and trench features with dimensions that are smaller than the resolution limit of conventional lithographic techniques. Sub-lithographic patterning of gate conductors is extremely difficult because of mask error enhancement factor (MEEF). MEEF increases as the exposure wavelength decreases. In general, lithographic resolution (w) is governed by three parameters: wavelength of light used in the exposure system ($\lambda$), numerical aperture of exposure system (NA), and a $k_1$ factor which is a measure of the level of difficulty of the process. Lithographic resolution can be defined by the following equation:

$$w = k_1 \frac{\lambda}{NA}$$

Resolution can be improved by an improvement in any of these factors or a combination of these factors (i.e., reducing the exposure wavelength, increasing the NA, and decreasing the $k_1$ factor). However, reducing the exposure wavelength and increasing the NA are expensive and complex operations.

Sub-lithographic resolution has been achieved using photoresist modification processes. Conventional photoresist modification processes typically pattern the photoresist in a conventional lithographic process and use chemical or heat procedures after development of the photoresist to reduce the size of the patterned features. One such process is the chemical amplification of resist lines (CARL) process developed by Siemens Corporation. In the CARL process, a liquid chemical is applied over the line features, resulting in a chemical reaction between corresponding chemical moities in the resist lines and the liquid chemical. This leads to swelling of the lines and a decrease in the width of the spaces between the line. During plasma etching, the width of the space transferred down into the underlying substrate is thus effectively reduced. Another such process is a heat reflow process, in which photoresist is partially liquified to reduce the distance between photoresist line spaces. Yet another such process reduces feature sizes by chemical etching.

Processes which manipulate the photoresist pattern after it is formed can be susceptible to unpredictable mechanical deformation as well as poor mechanical stability. For example, mechanical deformations can be caused by capillary forces, inadequate inherent mechanical stability, and/or the impact of etch and species. Accordingly, there is still a need to increase the resolution available through lithography.

Thus, there is a need to improve the resolution of lithography by decreasing the $k_1$ factor. Further, there is a need to achieve sub-lithographic patterning of gates and conductive lines. Further still, there is a need to reduce feature sizes without the use of heat flow and/or processes. Further still, there is a need for an inexpensive process for improving (reducing) the size of gate features which can be lithographically patterned. Yet further, there is a need to lithographically pattern photoresist using lower doses of radiation.

BRIEF SUMMARY OF THE INVENTION

An exemplary embodiment relates to an integrated circuit fabrication process. The process includes patterning a photoresist layer and providing an hydrophilic layer above the photoresist layer. The photoresist layer is disposed above a substrate. The polymers in the hydrophilic layer diffuse into exposed portions of the photoresist layer after providing the hydrophilic layer.

Another exemplary embodiment relates to a method of patterning a photoresist layer for an integrated circuit. The method includes providing a pattern of electromagnetic energy to a photoresist layer, providing an overlayer above the photoresist layer, and developing the photoresist layer. The photoresist layer is developed to form a photoresist pattern similar to the pattern of electromagnetic energy. Resolution is increased due to at least in part to the overlayer.

Still another exemplary embodiment relates to the lithographic medium. The lithographic medium includes a patterned photoresist layer including first regions of exposure to electromagnetic energy and second regions of non-exposure to the electromagnetic energy. The medium also includes a layer of hydrophilic material.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

In one embodiment of the present invention, an advantageous process for forming gate features patterned on a photoresist layer is provided. The features allow gate conductors or other line structures to be formed at dimensions smaller than conventionally possible. As used in the present application, the term feature can refer to a line feature in a photoresist material, an island of photoresist material, or other lithographically formed structure associated with photoresist materials.

Preferably, the process can be implemented in an inexpensive fashion using available tools and materials. The process can be used to form extremely small (e.g., sublithographic) gate structures with wide process latitude and smooth feature side walls. Further, the process can advantageously allow for the use of low exposure dose imaging, which in turn enhances exposure tool throughput relative to conventional processes.

The advantageous process comprises exposing (e.g., treating) a photoresist layer to a pattern of electromagnetic energy. A hydrophilic layer is provided above the photoresist layer that has been exposed to the pattern of electromagnetic energy. According to one embodiment, the hydrophilic layer diffuses into the photoresist layer leading to plasticization of polymers in the exposed portion of the photoresist layer. This phenomenon allows a lower dose of electromagnetic energy to be used to pattern the photoresist layer, thereby increasing resolution of the features. The lower dose can be utilized because diffusion from the hydrophilic layer ensures that the photoresist completely reacts to the pattern of electromagnetic energy.

Since the advantageous process may be implemented one or more times and at various points within an integrated circuit (IC) fabrication process, several embodiments will be described. However, the process of the present invention is not limited to the formation of any particular gate structure or region, and can be used in any process where photoresist is patterned.

A process flow 40 (FIG. 1) for lithographically patterning a structure in or on an IC wafer includes a photoresist application step 42, a soft bake step 44, an exposure step 46, a bake step 48, a hydrophilic layer coating step 50, a bake step 52, a photoresist developing step 54, and a processing step 56. In general, process 40 or portions of the process can be performed in a lithographic system 10. An exemplary lithographic system 10 is shown in FIG. 2.

Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to a wafer 24 positioned in lithography system 10. Wafer 24 includes a layer of photoresist material.

Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea. Preferably, chamber 12 and system 10 comprise a UV chamber designed for patterning with 248 nm, 193 nm, 157 nm, and 13.4 nm wavelength light.

Chamber 12 of lithographic system 10 can be a vacuum or low pressure chamber for use in ultraviolet (UV), vacuum ultraviolet (VUV), deep ultraviolet (DUV), extreme ultraviolet (EUV), x-ray, or other types of lithography. Chamber 12 can contain any of numerous types of atmospheres, such as, nitrogen, etc. Alternatively, chamber 12 can be configured to provide a variety of other patterning schemes.

Figure 1:
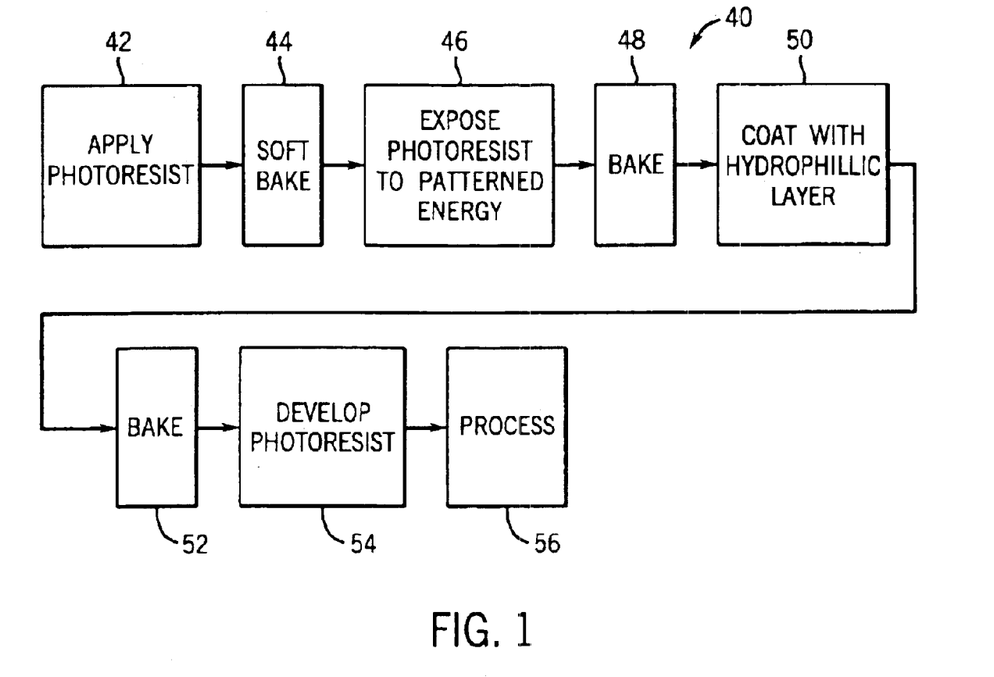
FIG. 1 is a flow diagram showing a photoresist patterning process for an integrated circuit wafer including a photoresist layer in accordance with an exemplary embodiment.
Figure 2:
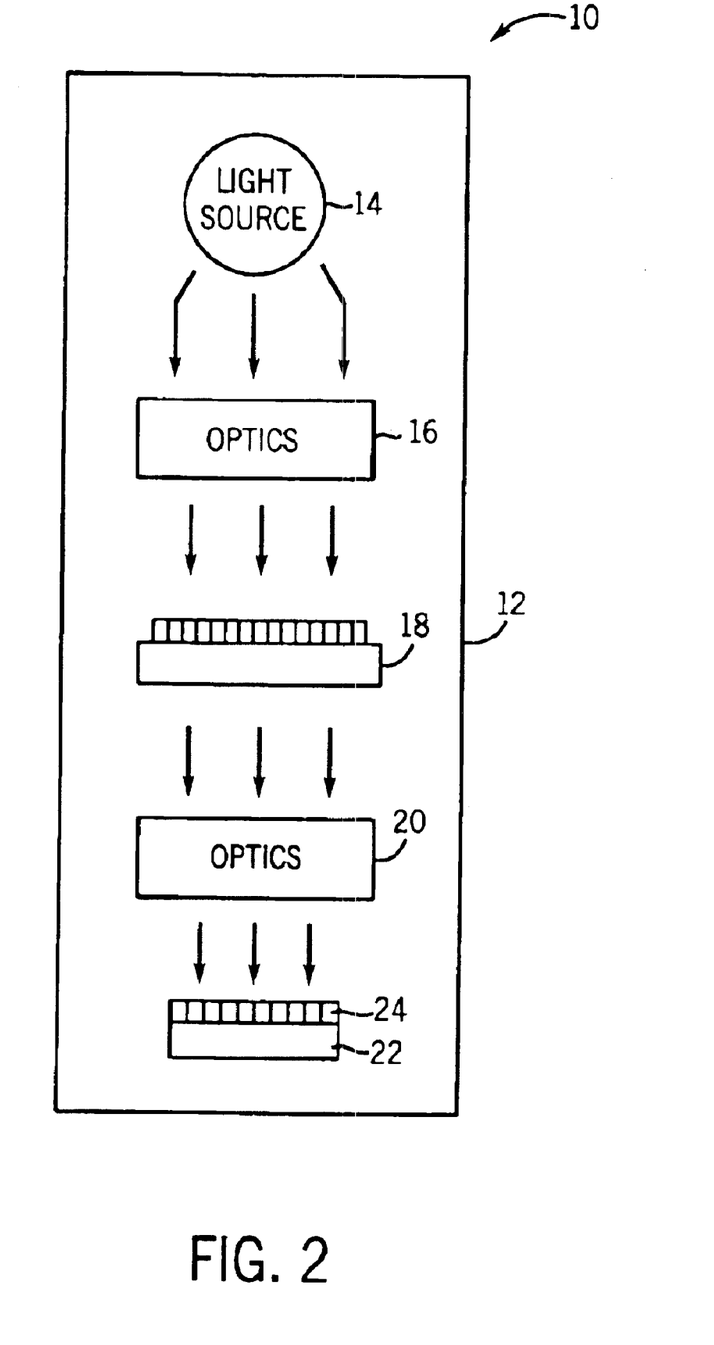
FIG. 2 is a block diagram of a system for patterning the photoresist layer in accordance with the process illustrated in FIG. 1.

Light source 14 provides electromagnetic energy (e.g., light, radiation, particle beams, etc.) through condenser lens assembly 16, mask or reticle 18, and objective lens assembly 20 to photoresist layer 30 in step 46 (FIG. 1). Light source 14 provides electromagnetic energy at a wavelength of 193 mm, although other wave lengths and light sources can be utilized. A light source having a wavelength of 365 nm, 248 nm, 157 nm, or 126 nm, or a soft x-ray source having a wavelength of 13.4 nm can also be utilized. Alternatively, light source 14 may be a variety of other energy sources capable of emitting electromagnetic energy, such as radiation having a wavelength in the ultraviolet (UV), vacuum ultraviolet (VUV), deep ultraviolet (DUV), extreme ultraviolet (EUV), x-ray or other wavelength range or electromagnetic energy, such as e-beam energy, particle beam energy, etc.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

System 10 is not described in a limiting fashion. Process 40 can be implemented utilizing any type of conventional lithographic equipment or modifications thereof. Further, future advances in lithographic equipment, such as those related to EUV and VUV technologies can be utilized to carry out process 40. Process 40 can utilize any equipment capable of patterning layer 30 with electromagnetic energy without departing from the scope of the invention.

Figure 3:
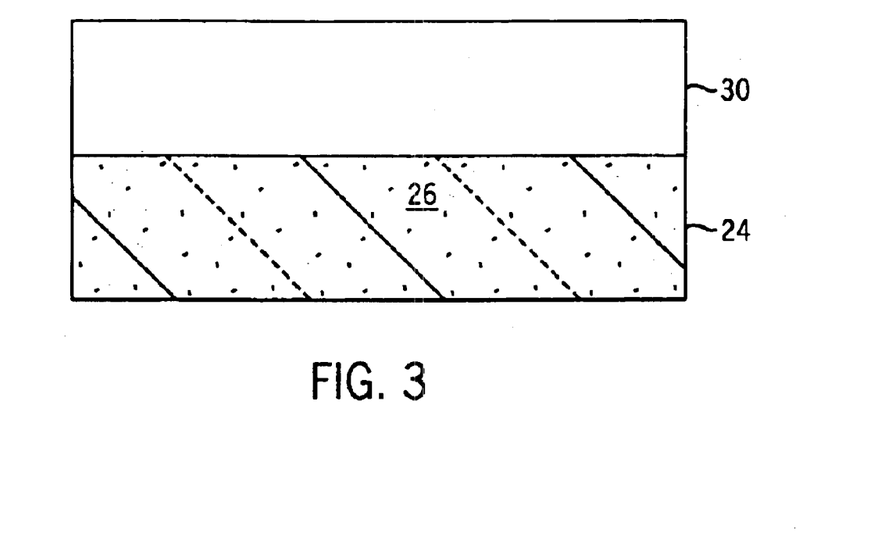
FIG. 3 is a cross-sectional view of a wafer for use in the process illustrated in FIG. 1, showing an application step for the photoresist layer.

With reference to FIG. 3, wafer 24 includes a substrate 26 and a photoresist layer 30. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, doped regions, etc., and can further include devices, such as, transistors, microactuators, microsensors, capacitors, resistors, diodes, etc.

Although photoresist layer 30 is shown disposed directly over substrate 26, intermediate layers can be provided between layer 30 and substrate 26. For example, layer 30 can be applied over an insulative layer, a conductive layer, a barrier layer, an anti-reflective coating (ARC), a mask layer or other layer of material to be etched, doped, or layered. In one embodiment, one or more layers of materials, such as, a polysilicon stack comprised of a plurality of alternating layers of titanium silicide, tungsten silicide, cobalt silicide materials, etc., can be between substrate 26 and layer 30.

In another embodiment, a hard mask layer, such as a silicon nitride layer or a metal layer, can be provided between substrate 26 and layer 30. The hard mask layer can serve as a patterned layer for processing substrate 26 or for processing a layer upon substrate 26. In yet another embodiment, an anti-reflective coating (ARC) can be provided between substrate 26 and layer 30.

Further, layer 30 can be provided over dielectric and conductive layers associated with interconnect or metal layers (e.g., metal 1, 2, 3, etc., ILP0, ILP1, ILP2, etc.). Substrate 26 and layers above it are not described in a limiting fashion, and can each comprise any conductive, semiconductive, or insulative material.

Photoresist layer 30 can comprise a variety of photoresist chemicals suitable for lithographic applications. Photoresist layer 30 is selected to have photocheraical reactions in response to electromagnetic energy emitted from light source 14. Materials comprising photoresist layer 30 can include, among others, a matrix material or resin, a sensitizer or inhibitor, and a solvent. Photoresist layer 30 is preferably a chemically or non-chemically amplified, positive tone photoresist. Photoresist layer 30 preferably includes a hydrophobic polymer and appropriate photoacid generator (PAG).

Photoresist layer 30 may be, but is not limited to, an acrylate-based polymer, an alicyclic-based polymer, a phenolic-based polymer, or a cyclo-olefin-based polymer. For example, photoresist layer 30 may comprise PAR-707 photoresist manufactured by Sumitomo Chemical Company.

Photoresist layer 30 is deposited, for example, by spin-coating over layer 28 in step 42 in FIG. 1. Photoresist layer 30 can be provided at a thickness of less than 1.0 $\mu$m. Layer 30 preferably has a nominal thickness (e.g., preferably 400 nm thick).

After application to substrate 26 or a layer above it, layer 30 is baked in step 44 (FIG. 1). Layer 30 can be soft baked to remove or dry out non-aqueous solvent associated with layer 30 (e.g., a pre-bake step). Preferably, layer 30 can be soft baked at a temperature a few degrees lower than the glass transition (Tg) of the photoresist polymer resin.

Mask or reticle 18 is a phase shift mask in one embodiment. For example, mask or reticle 18 may be an alternating phase shift mask or other type of mask or reticle. In a preferred embodiment, mask or reticle 18 is a bright field mask when system 10 is employed to fabricate gate conductors or conductive lines.

In another embodiment, mask or reticle 18 is a binary mask including a translucent substrate (e.g., glass or quartz) and an opaque or absorbing layer (e.g., chromium or chromium oxide). The absorbing layer provides a pattern or image associated with a desired circuit pattern, features, or devices to be projected onto photoresist layer 30.

Figure 4:
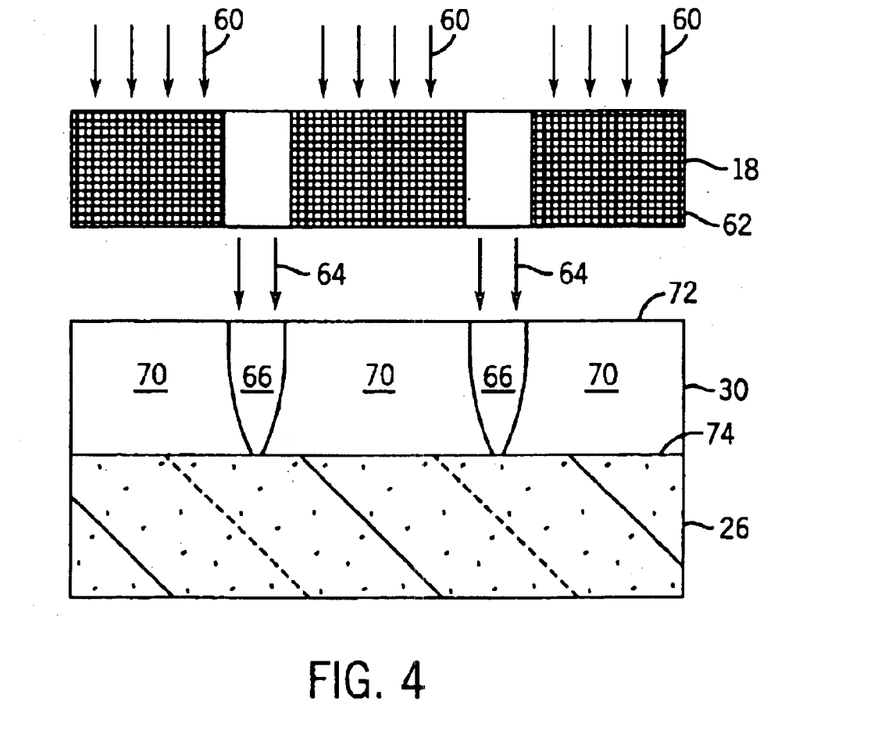
FIG. 4 is a cross-sectional view of a wafer for use in the process illustrated in FIG. 1, showing an electromagnetic energy patterning step for the photoresist layer.

With reference to FIG. 4, electromagnetic energy 60 from source 14 (FIG. 2) is effectively blocked by portions 62 of reticle 18. Preferably, reticle 18 is a bright field mask in this embodiment. However, electromagnetic energy 64 strikes layer 30 according to a pattern (e.g., portions 62) associated with reticle 18. The exposure to electromagnetic energy 64 provides a pattern in layer 30 of exposed regions 66 and unexposed regions 70. Alternatively, other techniques of and systems for providing patterned electromagnetic energy can be utilized.

As shown in FIG. 4, exposed regions 66 are generally wider at a top end 72 than a bottom end 74. Regions 66 have an increased concentration of photoacid due to the photoacid generated by being exposed to electromagnetic energy 64.

After exposure to electromagnetic energy 64, layer 30 is baked in step 48. Photoresist layer 30 is baked to enhance diffusion of the photoacid in region 66. In addition, the baking step causes thermolysis of the acid-labile protecting groups of the polymers in layer 30.

Figure 5:
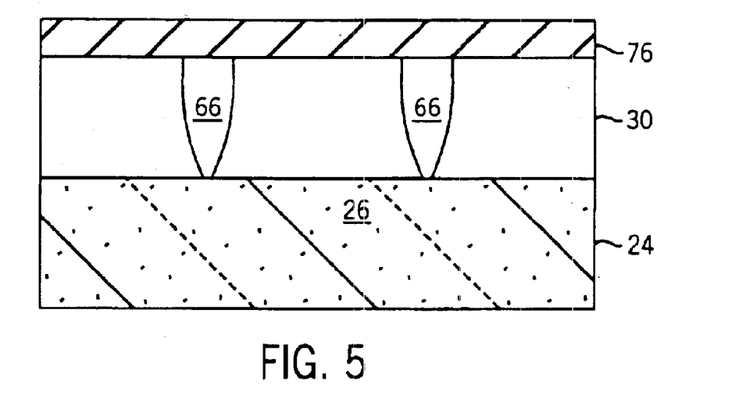
FIG. 5 is a cross-sectional view of a wafer for use in the process illustrated in FIG. 1, showing a hydrophilic overlayer deposition step for the photoresist layer.

With reference to FIG. 5, layer 30 is coated with a hydrophillic hydrophilic layer 76. In addition, layer 76 can be provided with a surfactant from an appropriate solvent on top of layer 30. Layer 30 preferably has a thickness of 300–1000 nm and is deposited by spin-coating. Layer 76 preferably has a thickness of 300–100 nm and is also deposited by spin-coating.

The provision of surfactants preferably improves the wetting, leveling and flow characteristics of layer 76 disposed over layer 30. Suitable surfactants include, but are not limited to, fluorosurfactants like 3M™ fluorad™ and 3M™ fluorosurfactant FC-4430. Alternative surfactants can be utilized.

Preferably, hydrophilic layer 76 is a polymeric hydrophilic overlayer (HOL) and has a lower glass transition temperature (Tg) than the polymer in photoresist layer 30. In one embodiment, layer 76 is able to diffuse into the polymer of the exposed portion of the photoresist layer 30 upon baking and is preferably phase compatible with the polymer in photoresist layer 30. Suitable materials for layer 76 include, but are not limited to polymers and co-polymers of: fluoroalkyl methacrylic acid, fluoroalkyl acrylic acid, alpha. and/or beta.-monoethylenically unsaturated monomers containing acid functionality, such as monomers containing at least one carboxylic acid group including acrylic acid, methacrylic acid, (meth)acryloxpropionic acid, itaconic acid, maleic acid, maleic anhydride acid, crotonic acid, monoalkyl maleates, monoakyl fumerates and monoalkyl itaconates; acid substituted (meth)acrylates, sulfoethyl methacrylate and phosphoethyl (meth)acrylate; acid substituted (meth)acrylamides, such as 2-acrylamido-2-methylpropylsulfonic acid and ammonium salts of such acid functional and acid-substituted monomers; basic substituted (meth)acrylates and (meth)acrylamides, such as amine substituted methacrylates including dimethylaminoethyl methacrylate, tertiary-butylaminoethyl methacrylate and dimethylaminopropyl methacrylamide; acrylonitrile; (meth) acrylamide and substituted (meth)acrylamide, such as diacetone acrylamide; (meth)acrolein; and methyl acrylate.

The above list for materials in layer 76 is not exhaustive. Layer 76 can include compositions or combinations of layers and materials. For example, layer 76 can be a multilayer or a composite layer comprised of combinations of materials listed above.

Figure 6:
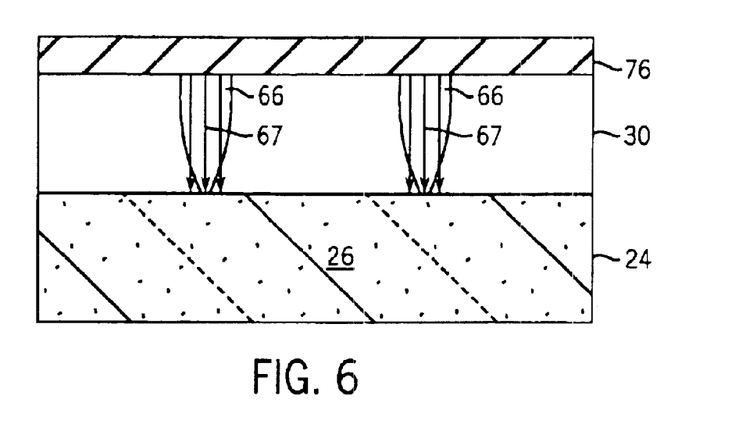
FIG. 6 is a cross-sectional view of a wafer for use in the process illustrated in FIG. 1, showing a baking step for the photoresist layer.

With reference to FIG. 6, wafer 24 is subject to baking in step 52. Preferably, layer 76 and layer 30 are baked at any temperature above the glass transition temperature (Tg) of layer 76 but below the glass transition temperature (Tg) of the polymer associated with layer 30.

Baking preferably enhances the diffusion of melted/glassy hydrophilic polymers and the surfactant into the polymer of photoresist layer 30, leading to plasticization of the polymer in exposed regions 66 of layer 30 relative to unexposed regions of layer 30.

Plasticization decreases the glass transition temperature (Tg) and enhances diffusion of the photoacid (as represented by arrows 67 in FIG. 6) within the exposed region 66 of layer 30 relative to unexposed portions. Increased diffusion of the photoacid increases the de-protection of the hydrophobic protecting groups like t-butyl ester group of the plasticized polymer of layer 30, thereby leading to increased formation of hydrophilic moieties like carboxylic acid moieties within the polymer of photoresist layer 30 relative to an exposed area of the same layer 30 without the use of layer 76. Accordingly, due to the increased diffusion of photoacid due to layer 76, a significantly lower exposure energy can be used to accurately and completely pattern layer 30.

The degree of diffusion of the hydrophilic polymer from layer 76 into the hydrophobic polymer of layer 30 is temperature dependent. The greater the temperature, the greater the degree of plasticization and diffusion. Also, the diffusion is a self-limiting process as it terminates when melted hydrophilic polymer concentration from layer 76 is exhausted. Therefore, the thicker the hydrophilic polymer (the thicker layer 76) results in greater diffusion into the polymer of photoresist layer 30 and consequently greater plasticization of the polymer of layer 30 and greater enhancement of diffusion of the photoacid within the polymer of layer 30.

As discussed above, greater enhancement of the diffusion of the photoacid within layer 30 results in greater enhancement of the de-protection reaction. Therefore, the baking temperature of step 52 and exposure dose of step 46 can be used to control the critical dimensions of the structure to be patterned. Therefore, baking temperatures, the thickness of layers 76 and 30, and energy dosages can be adjusted in accordance with the system parameters and design criteria.

Figure 7:
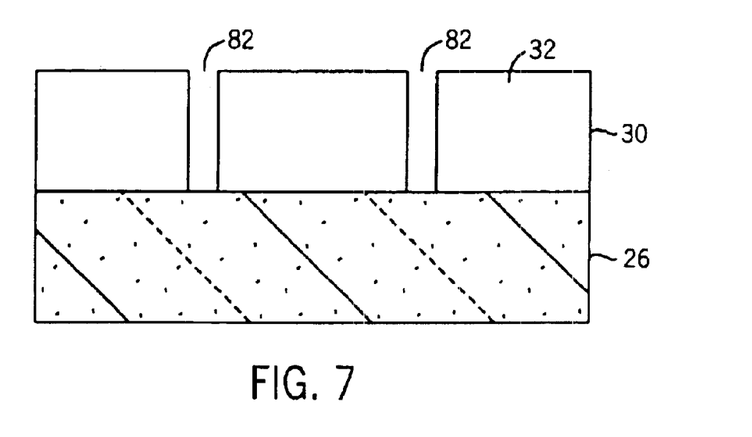
FIG. 7 is a cross-sectional view of a wafer for use in the process illustrated in FIG. 1, showing a development step for the photoresist layer.

With reference to FIG. 7, layer 30 is developed to provide features 32 defining lines or spaces 82 in step 54. Spaces 82 can be utilized in a variety of integrated circuit processing including trench formation as well as doping windows, or other integrated circuit fabrication processes. Lines 32 can be utilized in gate formation as well as conductive line formation.

In a preferred embodiment, layer 76 is removed in the developing process (step 54). Alternatively, layer 76 can be stripped before step 54 and after step 52. Layer 76 can be stripped by simply rinsing in de-ionized water.

Layer 30 is preferably developed in an aqueous basic solution such as 0.24N tetramethylammonium hydroxide. The aqueous basic solvent dissolves and washes away exposed regions 66 of the resist which include carboxylic acid moieties. Due to the preferential diffusion of layer 76 into exposed region 66 (FIG. 6) of layer 30 (enhanced de-protection of the photoresist polymer in regions 66), dissolution contrast is enhanced in exposed region 66 (FIG. 6) at significantly lower exposure doses. This provides improved critical dimension reduction, improved processing windows and exposure latitudes as well as smoother side walls, and line edge profiles of features 32 of layer 30 relative to features processed according to conventional fashions.

Figure 8:
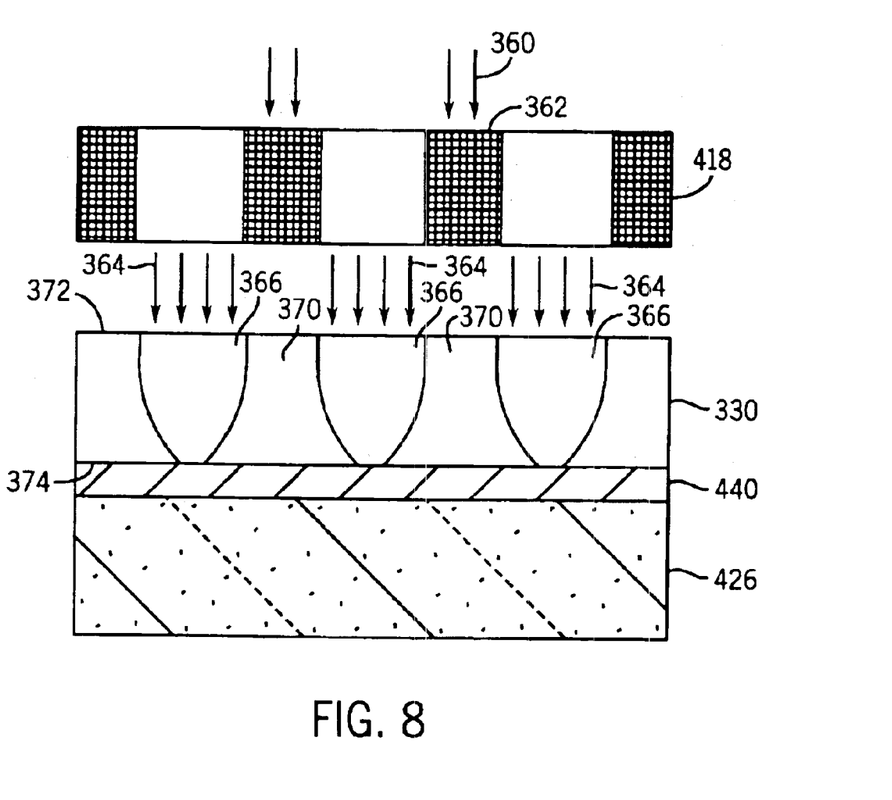
FIG. 8 is a cross-sectional view of a wafer for use in the process illustrated in FIG. 1, showing an electromagnetic energy patterning step for the photoresist layer.

With reference to FIGS. 8–14, process 40 (FIG. 1) will be described with respect to the formation of gate structures on a substrate 126. With reference to FIG. 8, a photoresist layer 330 is provided above a gate stack layer 440 which is provided above a substrate 426. Photoresist layer 330 is similar to photoresist layer 30 described with reference to FIG. 3.

Gate stack layer 440 can be a combination of conductor and/or dielectric layers appropriate for manufacturing a gate stack or gate conductor. Gate stack layer 440 can be for flash memory transistors, insulated gate field effect transistors, or other gate controlled devices. Alternatively, layer 440 can be a conductive layer such as a metal layer.

In FIG. 8, electromagnetic energy 360 from source 14 (FIG. 2) is effectively blocked by portion 362 of reticle 418. Preferably, in this embodiment reticle 418 is similar to reticle 18 discussed above, except that reticle 418 is a bright field mask. Electromagnetic energy 364 strikes layer 330 according to a pattern (e.g., portions 362) associated with reticle 418. The exposure to electromagnetic energy 364 provides a pattern in layer 330 of exposed regions 366 and unexposed regions 370. In a preferred embodiment, electromagnetic energy is provided according to the same parameters discussed with reference to FIG. 4.

As shown in FIG. 8, exposed region 366 are generally wider at a top end 372 than at bottom end 374 due to the attenuation of electromagnetic energy 364 by absorption in the photoresist. Regions 366 have an increased concentration of photoacid due to exposure to electromagnetic energy 364.

Figure 9:
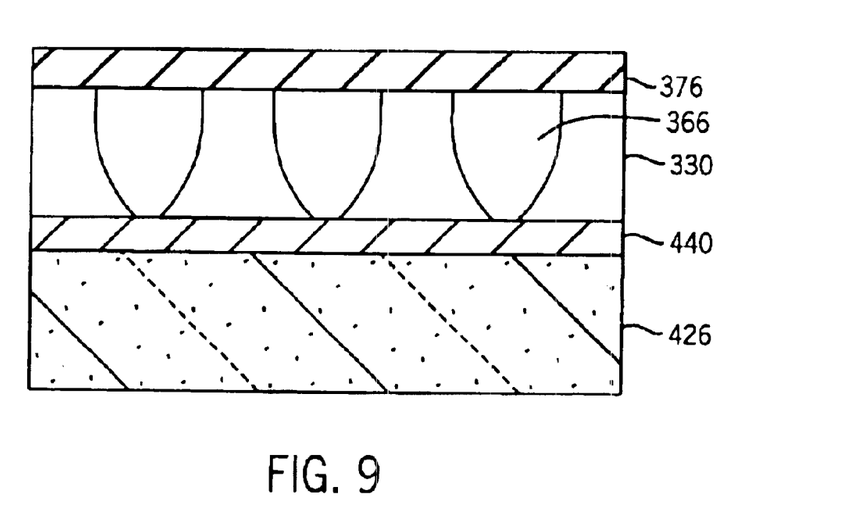
FIG. 9 is a cross-sectional view of a wafer for use in the process illustrated in FIG. 1, showing an overlayer deposition step for the photoresist layer.

After exposure to electromagnetic energy 364, layer 330 is baked in a step 48 (FIG. 1). With reference to FIG. 9, layer 330 is coated with a hydrophilic layer 376 similar to layer 76 discussed with reference to FIG. 5. In addition, layer 330 can be provided with a surfactant from an appropriate solvent on top of layer 330 similar to the surfactant used with layer 30 in FIG. 5.

Figure 10:
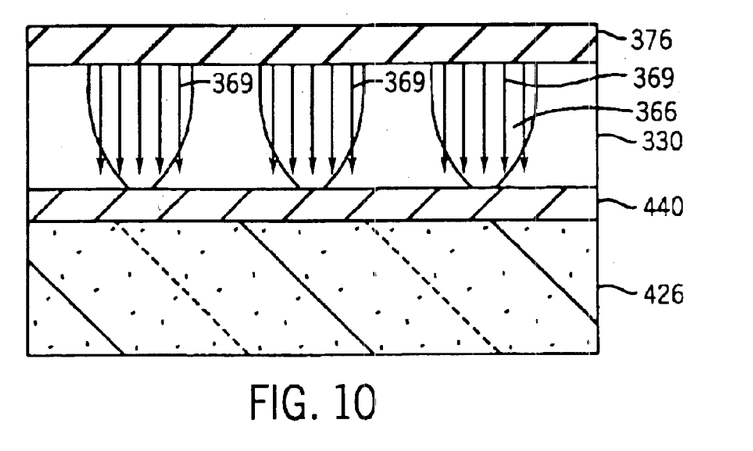
FIG. 10 is a cross-sectional view of a wafer for use in the process illustrated in FIG. 1, showing a baking step for the photoresist layer.

In a step 52 shown in FIG. 10, wafer 426 is subject to baking. Preferably, layer 376 and layer 330 are baked at any temperature above the glass transition temperature (Tg) of layer 376 both below the glass transition temperature (Tg) of the polymer associated with layer 330. Preferably, layers 376 and layers 330 can be baked similar to layer 76 and 30 discussed with reference to FIG. 6. As discussed above with reference to FIG. 6, baking enhances the diffusion into regions 366 as represented by arrows 369.

Figure 11:
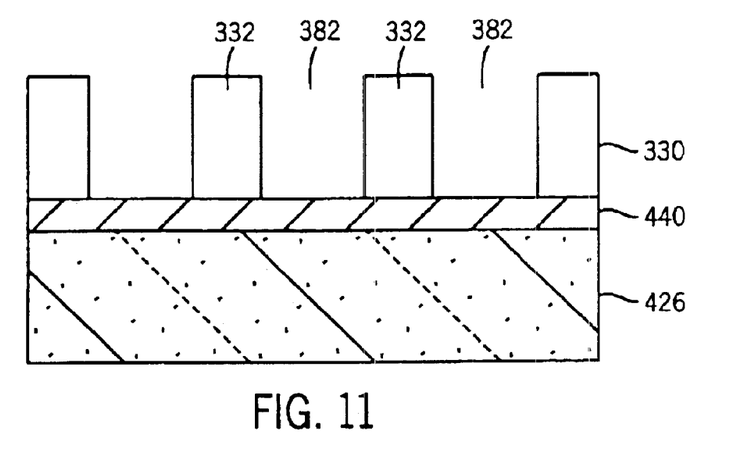
FIG. 11 is a cross-sectional view of a wafer for use in the process illustrated in FIG. 1, showing a development step for the photoresist layer.

With reference to FIG. 11, layer 330 is developed to provide features 332 defining lines or spaces 382. Features 332 are preferably used to form gate structures as discussed below. Alternatively, features 332 can be utilized to form other types of integrated circuit structures, such as conductive lines in a metal layer. In a preferred embodiment, layer 376 (FIG. 10) is removed in the developing process (step 54). Alternatively, layer 376 can be stripped before step 54 and after step 52.

Layer 330 is preferably developed in an aqueous basic solution such as 0.24N tetramnethylammoniumn hydroxide. The aqueous basic solvent dissolves and washes away exposed region 366 of the resist (FIG. 10) which includes carboxylic acid moities similar to the development process discussed with reference to FIG. 6.

Figure 12:
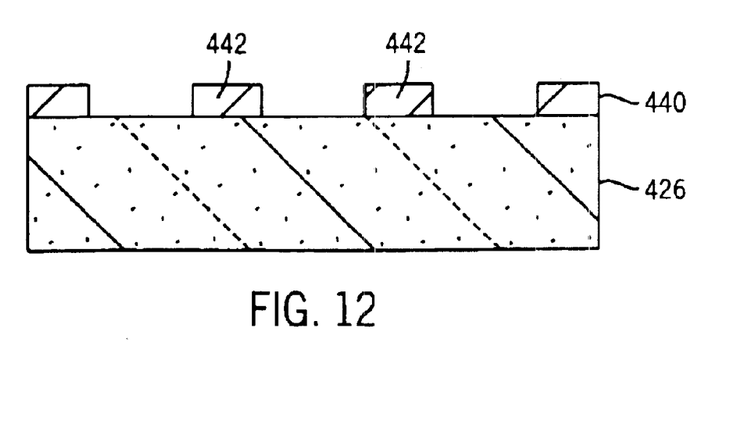
FIG. 12 is a cross-sectional view of a wafer for use in the process illustrated in FIG. 1, showing a gate conductor etching step.

With reference to FIG. 12, layer 440 is further processed to form gate structures or gate conductors 442. Layer 440 can be etched in a dry etching process to leave conductors 442 in accordance with features 332 (FIG. 12).

Figure 13:
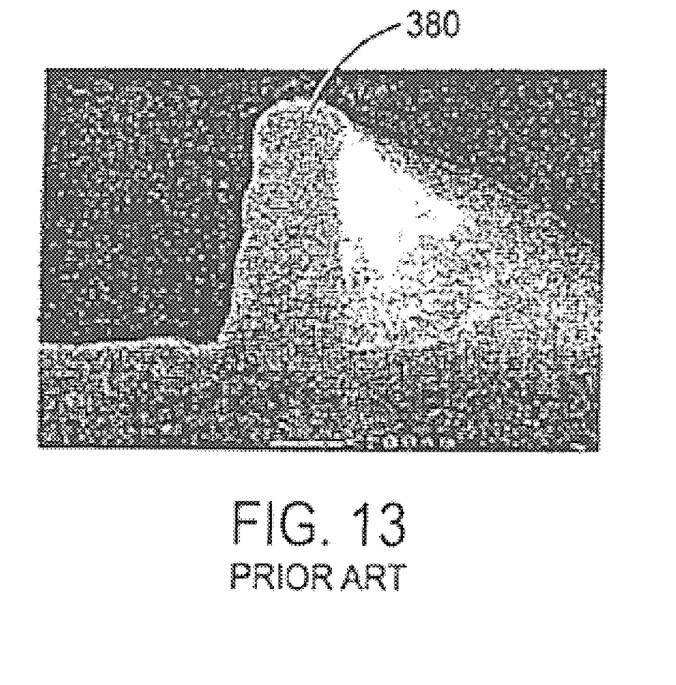
FIG. 13 is a representation of a micrograph of a gate structure formed in accordance with a conventional lithographic process.
Figure 14:
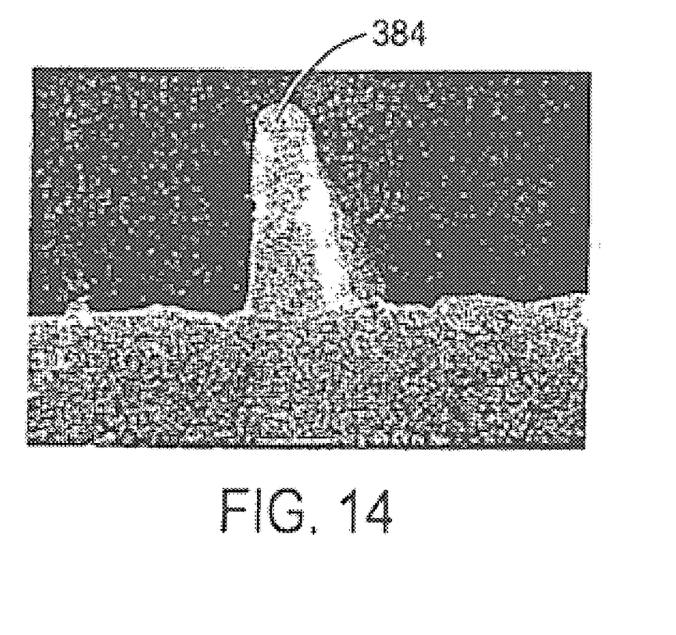
FIG. 14 is a representation of a micrograph showing a gate structure formed in accordance with an exemplary embodiment of the present invention.

With reference to FIG. 13, a representation of a SEM micrograph of a cross-section of a photoresist line feature 380 is shown. Photoresist line feature 380 is formed in accordance with a conventional process and has a critical dimension of approximately 170 nm. With reference to FIG. 14, a photoresist line feature 384 is formed according to the process discussed with reference to FIGS. 8–13. As can be seen in FIGS. 13 and 14, photoresist line feature 384 is narrower (e.g., 100 nm wide) and has smoother sidewalls than structure 380 (e.g., 170 nm wide), showing the advantages of process 40.

Figure 15:
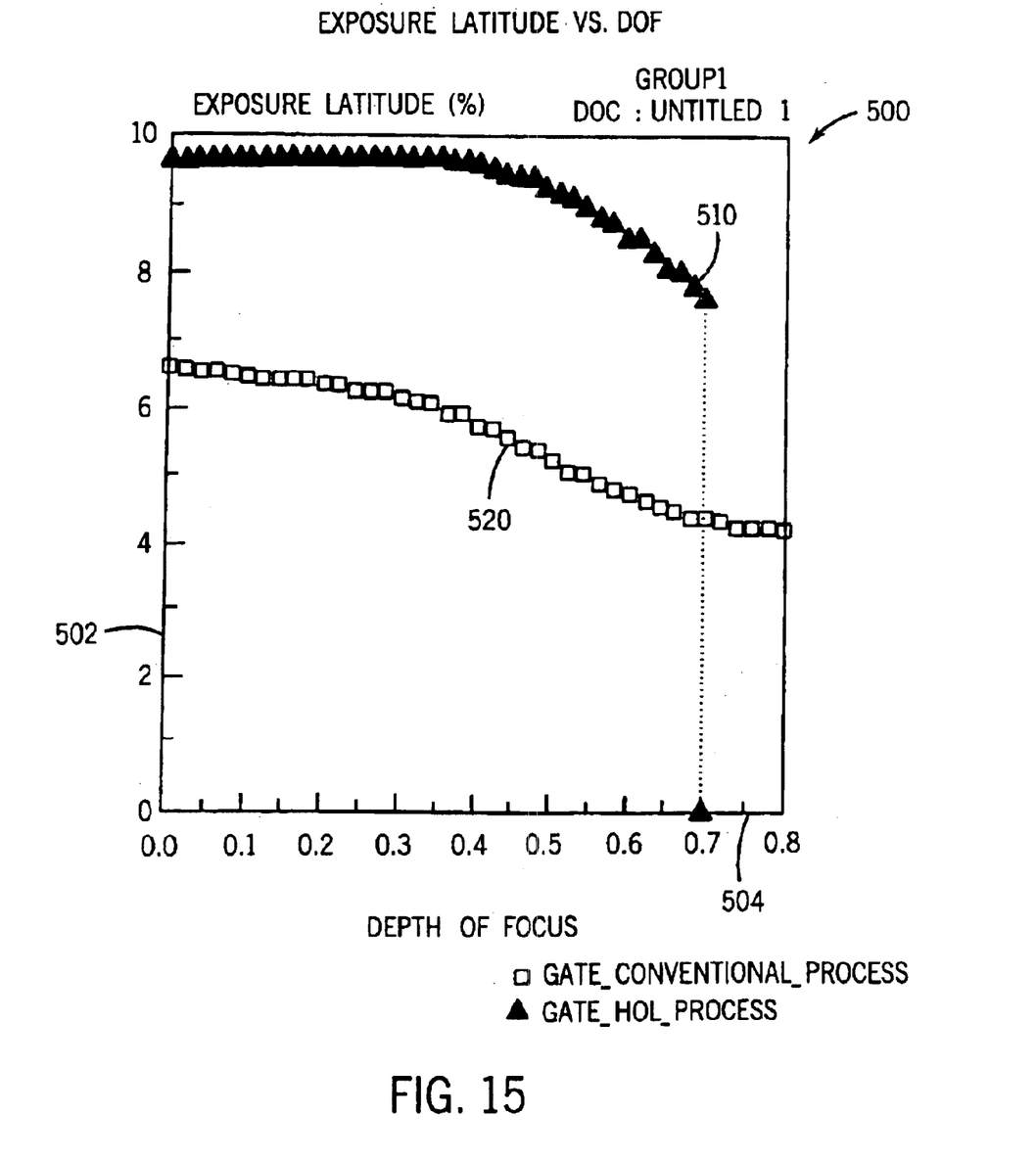
FIG. 15 is a process window comparison for gate structures printed with HOL and a conventional process.

With reference to FIG. 15, a graph 500 shows a process window comparison for gate structures printed with HOL and a conventional process, using 21.5 mJ/cm$^2$ and a 130 nm mask critical dimension, is shown. The Y-axis 502 represents the exposure latitude in percent, while the X-axis 504 represents the depth of focus in micrometers. A first curve 510 illustrates data obtained using the HOL process, while a second curve 520 illustrates data obtained using a conventional process. The process window is the area under each curve. The process window for the gate features patterned using the HOL process (e.g., the area under curve 510) is significantly higher than that for gate features patterned with the conventional process (e.g., the area under curve 520) using the same exposure conditions. The difference between the HOL process and the conventional process increases as the critical dimension approaches sub-lithographic levels, which may be due at least in part to the inability of the conventional process to print sub-lithographic features. The HOL process, in contrast, is capable of printing sub-lithographic features.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Further, although a conductive line and gate conductor process is discussed, the processed can be applied to any lithographic application. Various modifications may be made in the details disclosed without departing from the spirit of the invention as defined in the following claims.

What is claimed is:

1. An integrated circuit fabrication process, the process comprising:

exposing a photoresist layer to electromagnetic energy to form first regions of exposure and second regions of non-exposure in the photoresist layer, the photoresist layer being disposed above a substrate;

providing a hydrophilic layer above the first regions of exposure and the second regions of non-exposure, whereby polymers in the hydrophilic layer diffuse into the first regions of exposure layer after provision of the hydrophilic layer; and removing the first regions of exposure after diffusion of polymers into the first regions of exposure to leave the second regions of non-exposure above the substrate.

2. The process of claim 1, wherein the hydrophilic layer includes at least one of polymer or copolymer selected from the groups of fluoroalkyl methacrylic acid, fluoroalkyl acrylic acid, alpha., beta.-monoethyleniically unsaturated monomers containing acid functionality, such as monomers containing at least one carboxylic acid group including acrylic acid, methacrylic acid, (meth)acryloxypropionic acid, itaconic acid, maleic acid, maleic anhydride, furmaric acid, crotonic acid, monoalkyl maleates, monoalkyl fumerates and monoalkyl itaconates; acid substituted (meth) acrylates, sulfoethyl methacrylate and phosphoethyl (meth) acrylate; acid substituted (meth)acrylamides, such as 2-acrylamido-2-methylpropylsulfonic acid and ammonium salts of such acid functional and acid-substituted monomers; basic substituted (meth)acrylates and (meth)acrylamides, such as amine substituted methacrylates including dimethylaminoethyl methacrylate, tertiary-butylaminoethyl methacrylate and dimethylaminopropyl metbacrylamide; acrylonitrile; (meth)acrylamide and substituted (meth) acrylamide, such as diacetone acrylamide; (meth)acrolein; and methyl acrylate.

3. The process of claim 1, wherein the hydrophilic layer is provided with a surfactant.

4. The process of claim 1, further comprising baking the photoresist layer and hydrophilic layer.

5. The process of claim 4, further comprising developing the photoresist layer in an aqueous solvent.

6. The process of claim 5, wherein the aqueous solvent is a basic solvent.

7. A method of patterning a photoresist layer for an integrated circuit, the method comprising:

providing a pattern of electromagnetic energy to a photoresist layer to form first regions of exposure and second regions of non-exposure;

providing an overlayer above the photoresist layer;

diffusing polymers in the overlayer into the photoresist layer to plasticize polymers in the first regions; and developing the photoresist layer to remove the first regions after the diffusing step to form a photoresist pattern similar to the pattern of electromagnetic energy, the photoresist pattern comprising the second regions of non-exposure, whereby the plasticization of polymers in the first regions allows the developing step to utilize a relatively low exposure energy.

8. The method of claim 7, wherein the step of diffusing polymers comprises baking the overlayer and the photoresist layer to cause hydrophilic polymers in the overlayer to diffuse into the photoresist layer.

9. The method of claim 7, wherein the providing a pattern step utilizes a low dose of radiation.

10. The method of claim 9, wherein the pattern defines gate conductors for the integrated circuit.

11. The method of claim 7, wherein the developing step utilizes a basic aqueous solution.

12. The method of claim 7, wherein the overlayer includes at least one of polymer or copolymer selected from the groups of fluoroalkyl methacrylic acid, fluoroalkyl acrylic acid, alpha., beta.-monoethylenically unsaturated monomers containing acid functionality, and monomers containing at least one carboxylic acid group including acrylic acid, methacrylic acid, (meth)acryloxypropionic acid, itaconic acid, maleic acid, maleic anhydride, fumaric acid, crotonic acid, monoalkyl maleates, monoalkyl fumerates and monoalkyl itaconates; acid substituted (meth)acrylates, sulfoethyl methacrylate and phosphoethyl (meth)acrylate; acid substituted (meth)acrylamides, such as 2-acrylamido-2-methylpropylsulfonic acid and ammonium salts of such acid functional and acid-substituted monomers; basic substituted (meth)acrylates and (meth)acrylamides, such as amine substituted methacrylates including dimethylaminoethyl methacrylate, tertiary-butylaminoethyl methacrylate and dimethylaminopropyl methacrylarnide; acrylonitrile; (meth)acrylamide and substituted (meth)acrylamide, diacetone acrylamide, (meth)acrolein, and methyl acrylate.

13. A method of producing an integrated circuit, the method comprising:

providing a layer of photoresist material above a substrate;

exposing the layer of photoresist material to electromagnetic energy to provide first regions of exposure to the electromagnetic energy and second regions of non-exposure to the electromagnetic energy;

providing a layer of hydrophilic material above the first regions of exposure and the second regions of non-exposure;

heating the layer of photoresist material and the layer of hydrophilic material to cause constituents of the hydrophilic material to diffuse into the first regions of the layer of photoresist material; and developing the layer of photoresist material to provide a photoresist pattern by removing the first regions of the photoresist material after the heating step;

whereby resolution and process window are increased due at least in part to the layer of hydrophilic material.

14. The method of claim 13, wherein the layer of photoresist material includes a hydrophobic polymer.

15. The method of claim 13, wherein the first regions define gate conductors.

16. The method of claim 13, further comprising a surfactant adjacent the layer of hydrophilic material.

17. The method of claim 16, wherein the layer of hydrophilic material has a thickness of between approximately 30 and 100 nanometers.

18. The method of claim 13, wherein the step of developing the layer of photoresist material utilizes an aqueous solvent.

19. The method of claim 13, wherein the layer of photoresist material has a higher glass transition temperature than the layer of hydrophilic material.

20. The method of claim 13, wherein step of heating the layer of photoresist material and the layer of hydrophilic material comprises baking the layer of photoresist material and the layer of hydrophilic material at a temperature that is above the glass transition temperature of the layer of hydrophilic material and that is below the glass transition temperature of the layer of photoresist material.

* * * * *

UNITED STATES PATENT AND TRADEMARK OFFICE
CERTIFICATE OF CORRECTION

PATENT NO. : 6,884,735 B1
DATED : April 26, 2005
INVENTOR(S) : Okoroanyanwu et al.

It is certified that error appears in the above-identified patent and that said Letters Patent is hereby corrected as shown below:

Column 10,
Line 29, delete "monoethyleniically" and insert therefor -- monoethlenically --.
Line 33, delete "furmaric" and insert therefore -- fumaric --.
Line 43, delete "metbacrylamide" and insert therefor -- methacrylamide --.

Column 11,
Line 31, delete "methacrylarnide" and insert therefor -- methacrylamide --.

Signed and Sealed this

Ninth Day of August, 2005

JON W. DUDAS
*Director of the United States Patent and Trademark Office*